(12) United States Patent
Tilton et al.

(10) Patent No.: US 7,836,706 B2
(45) Date of Patent: Nov. 23, 2010

(54) THERMAL MANAGEMENT SYSTEM FOR EVAPORATIVE SPRAY COOLING

(75) Inventors: Charles L. Tilton, Colton, WA (US); Donald E. Tilton, Colton, WA (US)

(73) Assignee: Parker Intangibles LLC, Cleveland, OH (US)

( * ) Notice: Subject to any disclaimer, the term of this patent is extended or adjusted under 35 U.S.C. 154(b) by 0 days.

(21) Appl. No.: 10/260,713

(22) Filed: Sep. 27, 2002

(65) Prior Publication Data

US 2004/0060313 A1 Apr. 1, 2004

(51) Int. Cl.
*F25D 17/02* (2006.01)

(52) U.S. Cl. .......................... 62/64; 62/259.4

(58) Field of Classification Search ............ 62/259.2, 62/64, 259.4, 304, 310, 314; 165/80.4, 104.33, 165/168, 908; 361/699, 700, 689, 698
See application file for complete search history.

(56) References Cited

U.S. PATENT DOCUMENTS

| | | | | |
|---|---|---|---|---|
| 3,083,547 A * | 4/1963 | Stevens et al. | ............... | 134/125 |
| 4,399,484 A | 8/1983 | Mayer | ................... | 361/332 |
| 4,494,594 A * | 1/1985 | Kurzinski | ................... | 164/443 |
| 4,706,480 A * | 11/1987 | Svatos | ................... | 72/11.4 |
| 4,846,675 A * | 7/1989 | Soliman | ................... | 432/77 |
| 4,940,558 A * | 7/1990 | Jarboe et al. | ................... | 264/46.7 |
| 5,021,924 A | 6/1991 | Kieda et al. | ................... | 361/385 |
| 5,168,348 A | 12/1992 | Chu et al. | ................... | 257/713 |
| 5,220,804 A | 6/1993 | Tilton et al. | ................... | 62/61 |
| 5,311,931 A | 5/1994 | Lee | ................... | 165/109.1 |
| 5,349,831 A | 9/1994 | Daikoku et al. | ................... | 62/376 |
| 5,438,477 A * | 8/1995 | Pasch | ................... | 361/689 |
| 5,508,884 A * | 4/1996 | Brunet et al. | ................... | 361/698 |
| 5,516,884 A | 5/1996 | Bianconi | ................... | 523/397 |
| 5,548,612 A * | 8/1996 | Matsuo et al. | ................... | 373/73 |
| 5,675,473 A | 10/1997 | McDunn et al. | ............... | 361/699 |
| 5,687,577 A | 11/1997 | Ballard et al. | ................... | 62/61 |
| 5,718,117 A | 2/1998 | McDunn et al. | ................... | 62/61 |
| 5,719,444 A | 2/1998 | Tilton et al. | ................... | 257/714 |
| 5,746,585 A | 5/1998 | McDunn et al. | ......... | 117/177.11 |
| 5,761,035 A | 6/1998 | Beise | ................... | 361/699 |
| 5,768,103 A | 6/1998 | Kobrinetz et al. | ............ | 361/699 |
| 5,818,692 A | 10/1998 | Denney, Jr. et al. | ......... | 361/699 |

(Continued)

FOREIGN PATENT DOCUMENTS

EP 0429188 A2 * 5/1991

(Continued)

OTHER PUBLICATIONS

Abstract of JP 57-161023 A to Fujikake et al.*

(Continued)

*Primary Examiner*—Mohammad M Ali
(74) *Attorney, Agent, or Firm*—Wells St. John PS

(57) ABSTRACT

A thermal management system configured to maximize the potential of single and multiple atomizers to effectively cool microprocessors and other electronic devices. The thermal management system, which may be a heat spreader, provides surfaces that are disposed to increase the effectiveness of impinging coolant droplets, provide additional heat transfer area in some embodiments, and permit the efficient, customized and disparate thermal management of a recipient object of the thermal management.

20 Claims, 4 Drawing Sheets

U.S. PATENT DOCUMENTS

| | | | |
|---|---|---|---|
| 5,831,324 A | 11/1998 | Bang | 361/699 |
| 5,841,564 A | 11/1998 | McDunn et al. | 359/161 |
| 5,860,602 A | 1/1999 | Tilton et al. | 239/543 |
| 5,879,503 A | 3/1999 | McDunn et al. | 156/304.2 |
| 5,880,931 A | 3/1999 | Tilton et al. | 361/690 |
| 5,907,473 A | 5/1999 | Przilas et al. | 361/699 |
| 5,924,482 A | 7/1999 | Edwards et al. | 165/104.33 |
| 5,933,700 A | 8/1999 | Tilton | 419/6 |
| 5,937,937 A | 8/1999 | Sehmbey et al. | 165/104.33 |
| 5,943,211 A * | 8/1999 | Havey et al. | 361/699 |
| 6,014,238 A | 1/2000 | McDunn et al. | 359/161 |
| 6,016,969 A | 1/2000 | Tilton et al. | 239/1 |
| 6,054,095 A * | 4/2000 | Minato et al. | 266/81 |
| 6,060,966 A | 5/2000 | Tennant et al. | 333/202 |
| 6,064,572 A * | 5/2000 | Remsburg | 361/700 |
| 6,108,201 A * | 8/2000 | Tilton et al. | 361/689 |
| 6,115,251 A | 9/2000 | Patel et al. | 361/699 |
| 6,134,108 A | 10/2000 | Patel et al. | 361/695 |
| 6,178,766 B1 * | 1/2001 | Tong et al. | 62/305 |
| 6,205,799 B1 | 3/2001 | Patel et al. | 62/132 |
| 6,292,364 B1 | 9/2001 | Fitzgerald et al. | 361/699 |
| 6,300,167 B1 | 10/2001 | Raleigh et al. | 438/122 |
| 6,308,771 B1 | 10/2001 | Tavassoli | 165/80.3 |
| 6,349,554 B2 * | 2/2002 | Patel et al. | 62/259.2 |
| 6,362,956 B2 * | 3/2002 | Heirich et al. | 361/683 |
| 6,377,453 B1 | 4/2002 | Belady | 361/687 |
| 6,377,458 B1 | 4/2002 | Morris et al. | 361/699 |
| 6,457,321 B1 | 10/2002 | Patel et al. | 62/259.2 |
| 6,467,278 B1 * | 10/2002 | Hu et al. | 62/62 |
| 6,484,521 B2 * | 11/2002 | Patel et al. | 62/171 |
| 6,571,569 B1 * | 6/2003 | Rini et al. | 62/259.2 |
| 6,595,014 B2 * | 7/2003 | Malone et al. | 62/171 |
| 6,688,381 B2 * | 2/2004 | Pence et al. | 165/168 |
| 6,706,402 B2 * | 3/2004 | Rueckes et al. | 428/408 |
| 6,775,997 B2 * | 8/2004 | Bash et al. | 62/180 |
| 2001/0002541 A1 | 6/2001 | Patel et al. | 62/259.2 |
| 2002/0011249 A1 | 1/2002 | Augustine et al. | 62/171 |
| 2002/0050144 A1 | 5/2002 | Patel et al. | 62/259.2 |
| 2002/0075650 A1 | 6/2002 | Morris et al. | 361/699 |
| 2002/0112496 A1 | 8/2002 | Bash et al. | 62/259.2 |
| 2002/0112498 A1 | 8/2002 | Bash et al. | 62/259.2 |
| 2002/0113141 A1 | 8/2002 | Malone et al. | 239/124 |
| 2002/0113142 A1 | 8/2002 | Patel et al. | 239/128 |
| 2002/0114139 A1 | 8/2002 | Bash et al. | 361/719 |
| 2002/0114140 A1 | 8/2002 | Bash et al. | 361/719 |
| 2002/0135981 A1 | 9/2002 | Pautsch | 361/700 |

FOREIGN PATENT DOCUMENTS

| | | | |
|---|---|---|---|
| JP | DE003132112 A1 * | 3/1982 | |
| JP | 57-161023 A * | 10/1982 | |

OTHER PUBLICATIONS

Tilton, Donald E., "Spray Cooling" PhD dissertation, University of Kentucky, 1989.

Tilton, Donald E., Ambrose, Jay H., "Closed-System, High-Flux Evaporative Spray Cooling". Final Report, Air Force contract F33615-88-C-2860, 1989.

Donald E. Tilton, Charles L. Tilton, Clifford J. Moore, and Randy E. Ackerman, "Spray Cooling for the 3-D Cube Computer". 1994 InterSociety Conference on thermal Phenomena, pp. 169-176.

Tilton, D.E., tilton, Cl., Pais, M.R., and Chow, L.C., "Spray Cooling of simulated Electronic Chips in a Compact Package", Final Report, Air Force Contract F33615-89-C-2972, Oct. 1991.

Pais, M.R., tilton, D.E., Chow, Lc. And Maheficey, E.t., "High-Heat-Flux, Low-Superheat Evaporative Spray Cooling", AIAA Paper AIRR-89-024 1, 27th Aerospace Sciences Meeting, Reno, Nevada, 1939.

Tilton, D.E., Ambrose, J.H., and Chow, L.C., "Closed-System, High-Flux Evaporative Spray Cooling", SAE Paper 892316, Aerotech 89, Anneheim, CA.

Tilton, D.E., Tilton, C.L. Pais, M.R., and Morgan, M.J., "High-Flux Spray Cooling in a Simulated Multichip Module", ASME 1992 National Heat Transfer Conference, Aug. 9-12, San Diego, CA.

Marcos,A ., Chow, L., Du, Jian-Hua, Rini, D., Lindauer, J., "Spray Cooling at Low System Pressure", pp. 169-175, 18th IEEE.SEMI-THERM Symposium, 2002.

Tilton, Donald, "High Performance COTS DSP for Harsh Environments", COTS Journal, May/Jun. 1999.

Tilton, Donald E. And Kehret, William E., "Mist Cooling for Harsh Environment VME Electronics", RTC Magazine, May 1999.

Tilton, Donald, Partha, Arjun, and Borchelt, Fred, "Advanced Thermal Management for Multichip Modules", Electronic Packaging & Production, Aug. 1995.

Smetana, Bruce A. and Venkataramanan, Ph.D., Girl, Montana State University, "Advanced Thermal Management for High Density Distributed Power Systems". HFPC Conference, May 7-11, 1995.

Tilton, Donald E., Tilton, Charles L., Moore, Clifford J., Ackerman, Randy E., "Spray Cooling for the 3-D Cube Computer", InterSociety Conference on thermal Phenomena in Electronic systems, I-THERM IV, Washington DC, May 4-7, 1994.

Tilton, Donald E., Kearns, Donald A., Tilton, Charles L., "Liquid Nitrogen Spray Cooling of a Simulated Electronic Chip", Proceedings of the 1993 Cryogenic Engineering Conference, Albuquerque, New Mexico, Jul. 12-16, 1993.

Tilton, D.E., Tilton, C.L., Pais, M.R. And Chow, L.C., "Spray Cooling of Simulated Electronic Chips in a Compact package", Final Report, Air Force Contract F33615-89-C-2972, Oct. 1991.

Tilton, D.E., Chow, L.C., Mahefkey, E.T. And Switzer, G., "Critical Heat Flux Phenomena in Spray Cooling", AIAA Paper 90-1729, AIAA/ASME 5th Joint Thermophysics and Heat Transfer Conf., Seattle. WA, Jun. 18-20, 1990, also to appear AIAA Journal of Thermophysics and Heat Transfer.

Tilton, D.E., Ambrose. J.H., and Chow, L.C., "Closed-System, High-Flux Evaporative Spray Cooling", SAE Paper 892316, Aerotech 89, Anneheim, CA.

Pais, M.R., Tilton, D.E., Chow, L.C. and Mahefkey, E.T.. "High-Heat-flux, Low-Superheat Evaporative Spray Cooling". AIAA Paper AIRR-89-0241, 27th Aerospace Sciences Meeting, Reno. Nevada, 1989.

Boudreaux, P.J., Tilton, D.E., Appel. P.W., "Spray Cooling Microelectronics", IEEE International Physics Symposium, Orlando, FA. Apr. 30-May 3, 2001.

Websites: http://www.spraycool.com: http://www.navysbir.brtrc.com/SuccessStories/lsothermalSystems.pdf.

AIAA-87-1536 "High Power Density Evaperative Cooling". D.E. Tilton, L.C. Chow, Univ. of Kentucky, Lexington, KY; and E.T. Mahefkey, Aero Propulsion Lab., Wright-Patterson AFB, OH.

"Thermal Management of Multichip Modules with Evaporative Spray Cooling", EEP vol. 26-2, Advances in Electronic Packaging - 1999, vol. 2, ASME 1999.

"Effects of Surface Roughness on Water Droplet Impact History and Heat Transfer Regimes" vol. 40, No. 1, pp. 73-88, 1997, Copyright 1996 Elsevier Science Ltd. John D. Bernardin, Clinton J. Stebbins and Issam Mudawar.

"Surface Roughness and its Effects on the Heat Transfer Mechanism in Spray Cooling", M. R. Pais and L. C. Chow, Dept. of Mechanical Engineering, University of Kentucky, Lexington KY 40506, ASME Winter Annual Meeting, San Francisco, CA Dec. 1989.

* cited by examiner

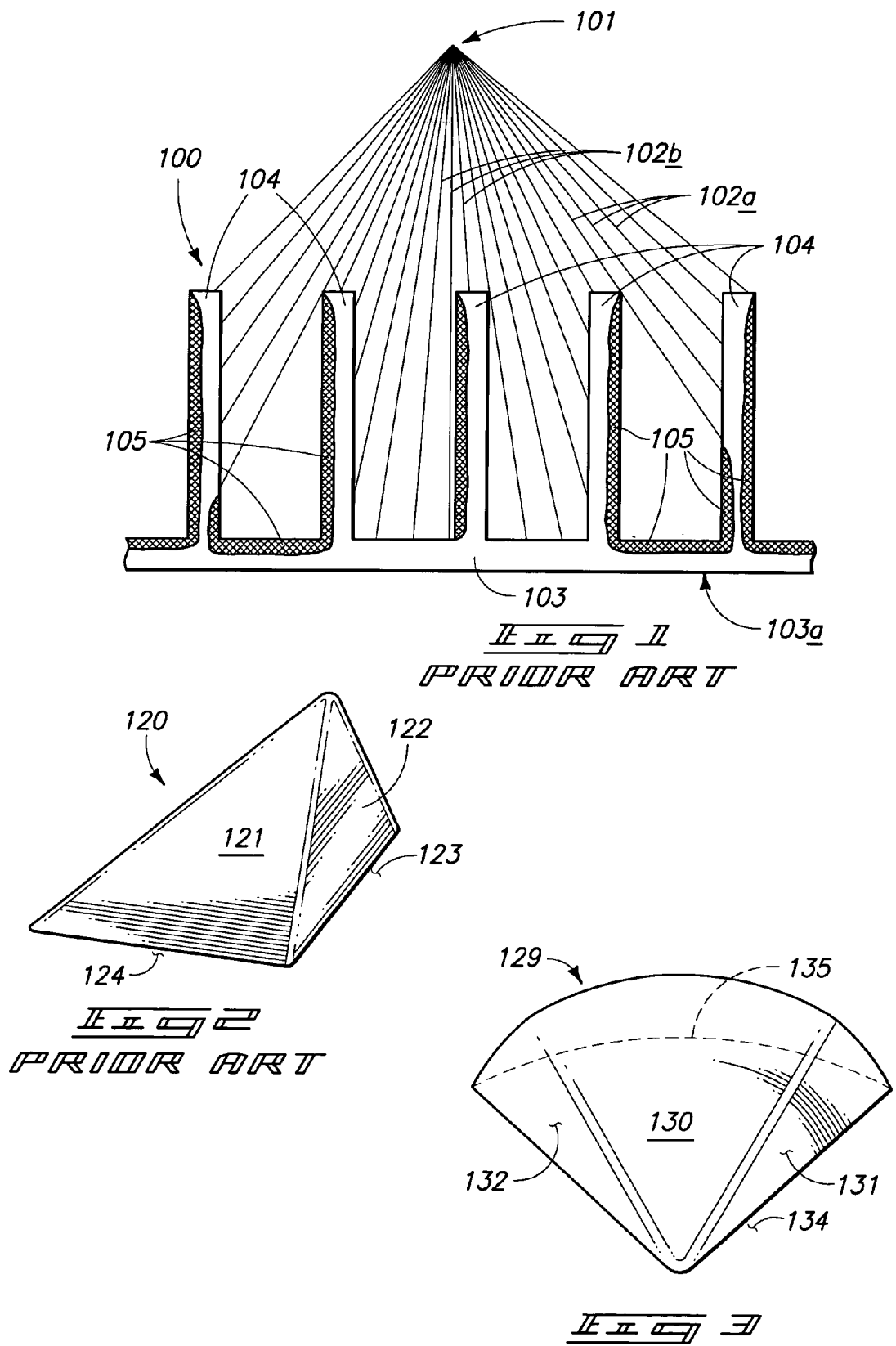

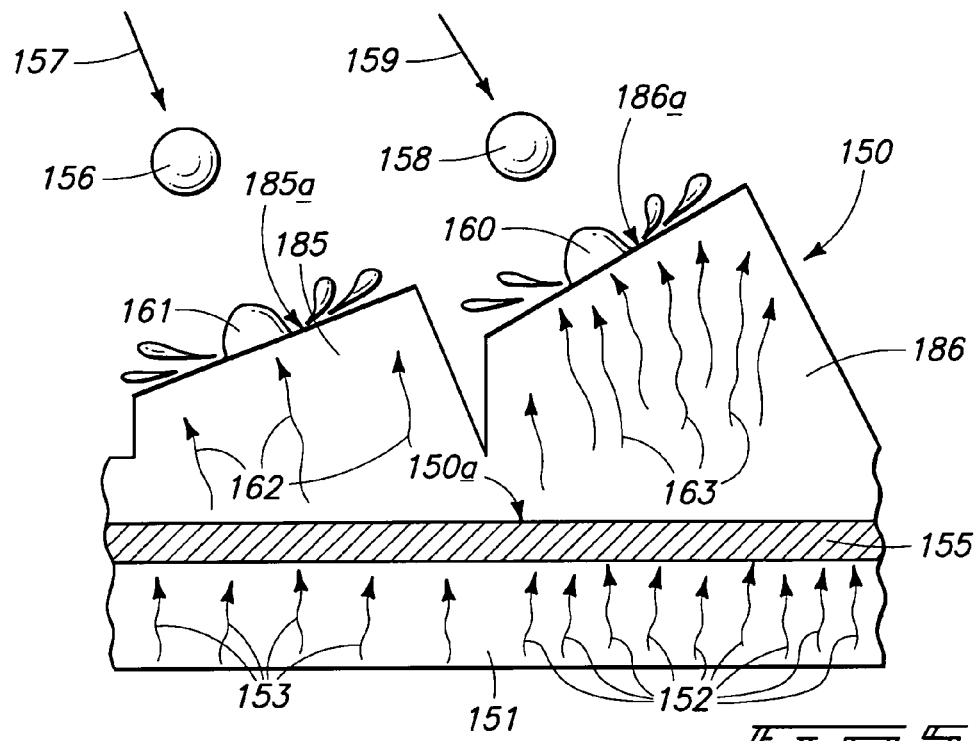
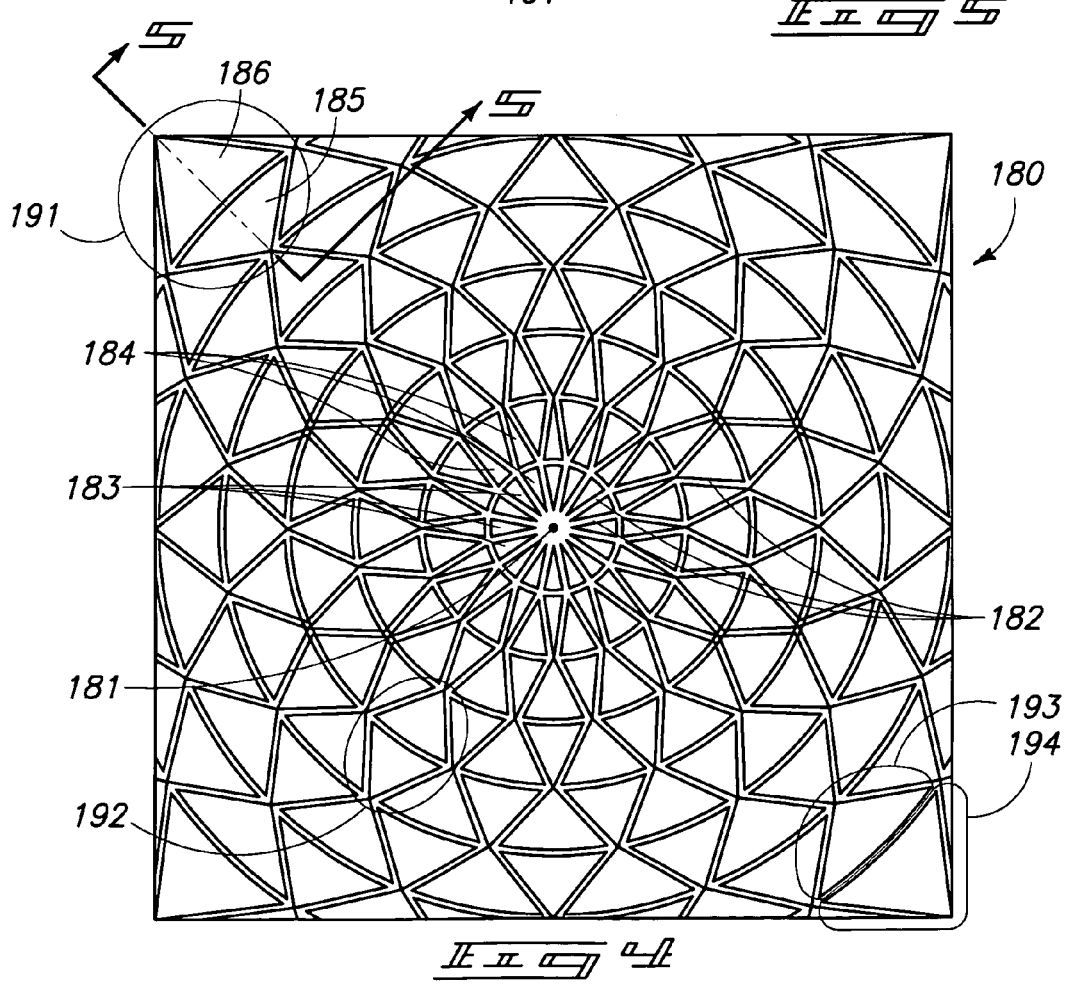

THERMAL MANAGEMENT SYSTEM FOR EVAPORATIVE SPRAY COOLING

CROSS REFERENCE TO RELATED APPLICATION

There are no related applications.

TECHNICAL FIELD

This invention relates to a thermal management system for the thin-film evaporative spray cooling of recipient devices such as electronic components, integrated circuit devices, semiconductor chips, and others. More particularly, this invention relates to a thermal management system which provides cooling, improved local cooling characteristics and reduced heat fluxes in the recipient device.

BACKGROUND OF THE INVENTION

The rapid technological advancement of electronic components has created a growing need to provide thermal management systems which provide higher capacities to cool the electronic components and/or which provide localized solutions to reduce heat flux and temperature gradients across the electronic component being thermally managed.

The localized and general increases in power for electronic components, combined with decreasing sizes and packages of the components, has created a need for improved thermal management. There is a need for higher heat transfer capabilities and for dissimilar heat transfer rates across an electronic component to reduce or eliminate the heat flux and/or temperature gradient across the electronic component being thermally managed.

In a typical evaporative spray cooling system for example, cooling is achieved by maintaining a thin liquid film flow over the device or electronic component to be cooled. If there is insufficient flow or coverage of the coolant, the liquid layer covering the electronic component will dry out and cause the component to overheat if it must rely on mere convection for the heat transfer. If excessive coolant flow to the component is provided, the device will become flooded and may tend to produce hot spots which may not be sufficiently cooled, which may lead to localized failure.

In a given electronic component there may be one or more hot spots where appreciably more heat must be removed to maintain a more uniform heat or temperature distribution across the component. Temperature gradients across electronic devices are generally not preferred. For most electronic devices, the localized failure on an electronic component results in the failure of the entire electronic component.

In order to achieve the desired thermal management and/or cooling, the vapor generated at the surface of the component is allowed to flow over the device, which generally requires an effective escape route or area to which the vapor and/or coolant must be allowed or directed to flow, thus maintaining the critical flow over the area of the electronic component being thermally managed.

In most embodiments of spray cooling systems, the flow of the vapor over the surface of the liquid coolant on the electronic component contributes to the maintenance of the flow of the coolant over the recipient surface, and to the effectiveness of the cooling. Providing for the continued flow and the escape or removal of the vapor generated at the surface of the electronic component further helps reduce the chances of film boiling heat transfer failure mode, also generally referred to as burnout.

Even when the volume flux of coolant is properly matched to the heat flux of the device, the excess fluid sprayed within a cavity should be managed to prevent the overflow from adjacent components from interfering and causing flooding type failure conditions. One way to manage the excess fluid is by the method and ways described in U.S. Pat. No. 5,220,804, which is incorporated herein by this reference. In these general types of embodiments, the momentum from the atomized droplets is utilized to contribute to the vapor flow over the surface within the chamber. The momentum from the atomized droplets may also be conserved by providing an escape route or slot which provides the channel, means or area to allow the flow, reducing the resistance to the flow or momentum of the atomized droplets. The conservation of the momentum reduces or avoids a counter-flow or back-flow of coolant and/or vapor against the flow of the atomized droplets to the recipient surface. Hence the combined utilization and conservation of the momentum of the atomized droplets in some embodiments or applications, contributes to the overall effectiveness of these systems.

It is an objective of some embodiments of this invention to provide a thermal management or evaporative spray cooling system to deliver higher capacity cooling to one or more electronic components.

It is an objective of some embodiments of this invention to provide a thermal management system which reduces the temperature gradient across an electronic component being cooled, by providing greater cooling capacity to local areas of an electronic components It is an objective of some embodiments of this invention to provide a system for customizing a thermal management system to a recipient electronic component based on altering and localizing the approximate impingement angles of coolant droplets impacting the recipient surface, in a spray cooling environment.

It is an objective of some embodiments of this invention to provide a thermal management system which tends to equalize the travel distance of atomized coolant droplets leaving an atomizer at different radial angles, to a recipient surface.

BRIEF DESCRIPTION OF THE DRAWINGS

Preferred embodiments of the invention are described below with reference to the following accompanying drawings.

FIG. 1 is an elevation schematic representation of two exemplary spray patterns from two adjacent atomizers, on a typical planar prior art surface to be cooled;

FIG. 2 is a schematic elevation view of a typical prior art heat dissipation system which utilizes heat transfer fins, illustrating the shadowing that occurs relative to the impacting coolant droplets;

FIG. 3 is a perspective view of one embodiment of a raised impingement component with an impingement surface;

FIG. 4 is a perspective view of another exemplary embodiment of a raised impingement component with an impingement surface;

FIG. 5 is a top view of one of numerous possible patterns which may be formed in an embodiment of the invention, illustrating numerous raised impingement components with impingement surfaces, and drainage channels, about a central area corresponding to an atomizer;

DETAILED DESCRIPTION OF THE PREFERRED EMBODIMENTS

Figure 6:
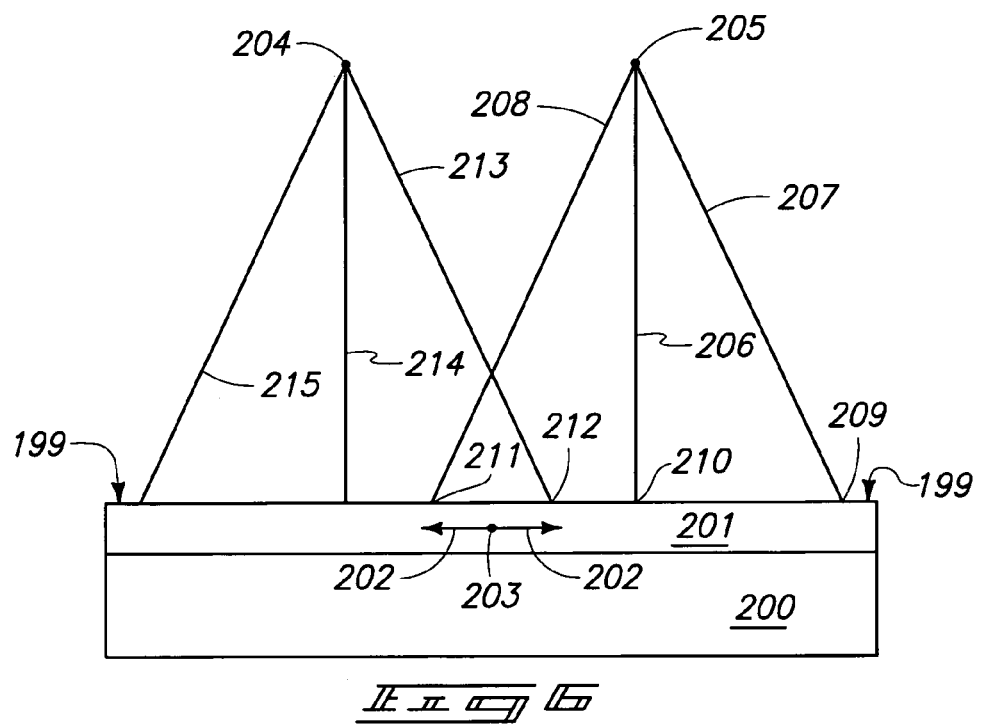
FIG. 6 is section view 6—6 from FIG. 5, and is a schematic representation of two raised impingement components with impingement surfaces on an electronic device, with coolant droplets impacting the impingement surfaces.

Many of the fastening, connection, manufacturing and other means and components utilized in this invention are widely known and used in the field of the invention described, and their exact nature or type is not necessary for an understanding and use of the invention by a person skilled in the art or science; therefore, they will not be discussed in significant detail. Furthermore, the various components shown or described herein for any specific application of this invention can be varied or altered as anticipated by this invention and the practice of a specific application or embodiment of any element may already be widely known or used in the art, or by persons skilled in the art or science; therefore, each will not be discussed in significant detail.

The terms "a", "an", and "the" as used in the claims herein are used in conformance with long-standing claim drafting practice and not in a limiting way. Unless specifically set forth herein, the terms "a", "an", and "the" are not limited to one of such elements, but instead mean "at least one".

Applicant hereby refers to and incorporates by this reference the following U.S. patents: U.S. Pat. No. 5,675,473 issued Oct. 7, 1997; U.S. Pat. No. 5,220,804 for a high heat flux evaporative spray cooling system; and U.S. Pat. Nos. 5,860,602 and 6,016,969, each for a laminated array of pressure swirl atomizers. The laminated array of pressure swirl atomizer patents referred to above may be utilized as one way or mechanism to accomplish the atomizing, even though there are numerous others which are available or known in the art, such as button atomizers and others, and which may be utilized in embodiments of this invention, with no one in particular required to practice this invention.

The term "electronic component" as used herein includes, without limitation, semiconductor chips, integrated circuit chips, devices, power conversion devices, laser diodes, memory devices, and any and all other electronic devices or the packaging, covers, and heat sinks therefore.

The term "raised surfaces" as used herein is meant to include raised surfaces and other protruding surfaces which project or protrude away from a base or away from the drainage channels. The raised structure of which the surface is a part, may be referred to as the impingement component, and the surface itself may also be referred to as the impingement surface. The term applies whether part of the raised surface intersects or is part of the base or drainage channel, or starts at the base or drainage channel at a first end and projects, protrudes or projects toward a second end of the raised surface. Thus the term "raised surface" applies to surfaces which protrude downward if, in the specific application, the spraying is occurring upward, or at any other relative angle. Furthermore the surface need not be flat, smooth or any other specific configuration within the scope of this invention.

The term "drainage channel" or "drainage channels" as used herein means channels among the raised surfaces configured to receive a flow of cooling fluid from the raised surfaces or elsewhere, and provide a channel to allow drainage or flow of the coolant where desired. These may be specific channels configured between raised surfaces, or they may channels or grooves formed or defined at the recipient base by the raised surfaces.

The term "normalizing", such as in an impact angle relative to an impingement surface, as used herein, means configuring the impingement surface, or a portion thereof, relative to the orifice of an atomizer, to generally make the impact angle more normal or closer to ninety degrees. This generally improves the heat transfer rate or effectiveness of the impacting droplets.

The term impingement angle or average impingement angle is used to identify the angle of flight of the coolant droplet at or before impact on the impingement surface or cooling surface, typically measured as a variance from a normal or ninety-degree angle.

The Critical Heat Flux ("CHF") in some applications has been found to vary significantly as the impingement angle is changed. For example, the Critical Heat Flux at an impingement angle of zero, which refers to impact normal to the recipient surface at the approximate point of impact, may be a magnitude of approximately one, whereas the CHF may only be approximately six-tenths when the impingement angle is approximately fifteen degrees. Interpolating these Critical Heat Flux parameters, the Critical Heat Flux for an approximate impingement angle of five degrees may be between eight-tenths and nine-tenths, whereas the Critical Heat Flux for an approximate impingement angle of ten degrees may be approximately seven-tenths.

The use of heat spreaders, or heat sinks, is commonly used in electronics thermal management today. The use of a heat spreader is dictated when the density of the heat dissipation exceeds the capacity of the cooling medium, usually air, to remove. These heat-spreading devices are generally designed for rectilinear flow, i.e., the streamlines of the air or liquid approaching the heat spreader are all parallel. Liquid evaporative spray cooling has a much higher cooling capacity than air, and in most cases a heat spreader is not required. However, in some cases the density of the power dissipation even exceeds the capacity of spray cooling, a conventionally designed heat spreader is ineffective because the spray droplets do not have parallel streamlines.

In a typical spray cooling application, the diffuse coolant droplet spray originates from a small orifice, typically in the range of 0.010 inch in diameter, and the droplets move outward in a radial fashion from this point. The result is that large percentages of the total fin area in a prior art heat spreader are "shadowed" and do not receive any of the sprayed droplets. Additionally, the angle of droplet impingement on the vertical sides of the fins that do get sprayed results in relatively poor heat transfer. These effects are illustrated in FIG. 2, as described more fully below.

In these spray cooled systems, such as those available through Isothermal Systems Research ("ISR"), the spray cooling technology operates at relatively low operating pressures, typically less than 40 psi. The systems may utilize any one of a number of different coolants, such as those known and available through the 3M Corporation, a perfluorocarbon or hydrofluoroether fluid, which are known in the industry for use in electronics thermal management systems.

The current microprocessor size and power consumption trends indicate that in the next several years, and beyond, products will emerge with heat fluxes that exceed the capability of this technology. The potential need for increased heat transfer capacity is not limited to high overall heat flux conditions but also includes microprocessor "hotspots" that generate local heat fluxes two to five times (or more) the average heat flux. These hotspots can lead to local dry-out conditions, and/or significant variations in silicon temperatures, or temperature gradients. Such temperature non-uniformities lead to timing issues that force lower clock rates and reduced processor performance in the electronic components.

While improvements can always be made in system design and operating parameters, and there is some potential for improved coolants, the most expedient improvements lie in heat transfer surface enhancements or heat spreading devices.

In an aspect of the invention, numerous small surfaces are provided and positioned to maximize the desired coolant droplet impingement. This may generally be accomplished in embodiments of this invention by providing at least a partial radial pattern of small structures configured to present a surface approximately normal to the droplet trajectories at each successive radial position. These recipient surfaces would be separated by fluid drainage passages or channels.

One way that the relative size of each surface and drain passage may be determined for a given application is by the volume flux of excess liquid that needs to be removed from the recipient surface. These ratios would change in a radial progression outward based upon the increasing amount of excess liquid. The arrangement of the cooling structures and drain channels are also preferably configured to prevent the excess liquid in the drainage channels from "washing" up onto the cooling faces of the impingement components, side surfaces, and/or recipient surfaces.

The drainage passages or channels, in many embodiments of the invention, will be important. Spray cooling heat transfer performance is generally inversely proportional to the thickness of the liquid layer, and in many aspects of the invention, the thinner the liquid layer, the better the spray cooling heat transfer performance. The cooling faces therefore preferably drain quickly and efficiently into the channels or passages. The channels (and unsprayed surfaces of the cooling structures) may also provide some cooling or heat dissipation functions, which may be enhanced if the surface of the heat spreader contains micro-pores that promote bubble nucleation.

Figure 7:
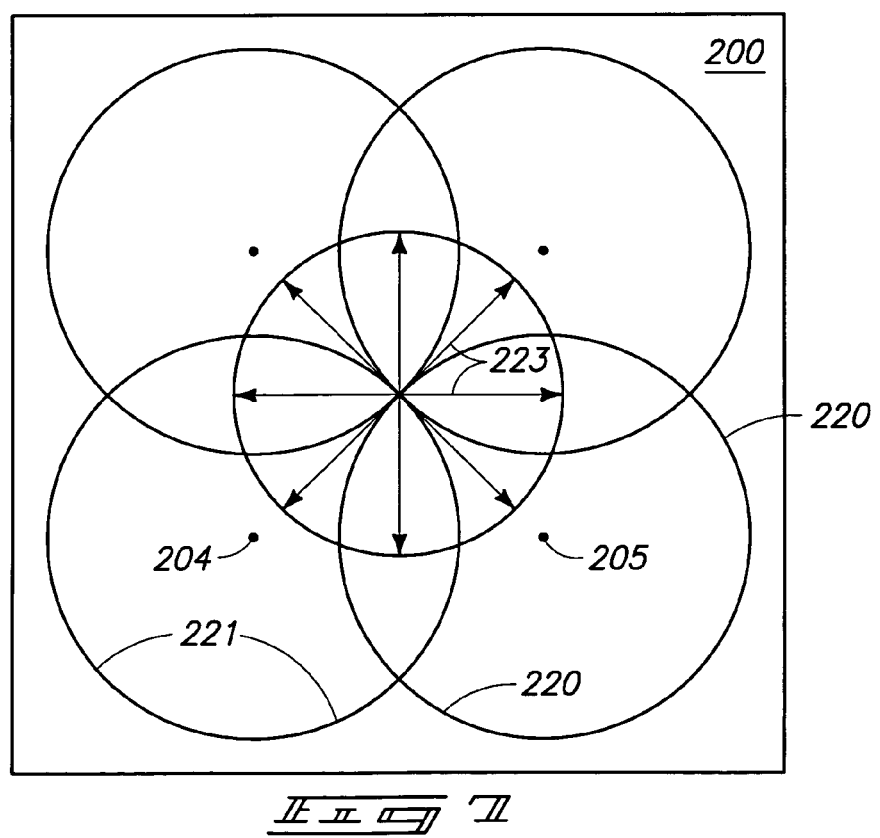
FIG. 7 is a top schematic view of a four atomizer configuration, illustrating an exemplary spray pattern and the fluid conflict between overlapping sprays.

A further consideration in the design of the fluid drainage passages in many embodiments of the invention in which the excess fluid generally flows outwardly, there may be regions of the surface where the outward flow, or flow, is opposed by new spray droplets, as shown in FIG. 7 as one example. This will be especially possible when multiple atomizers are used to cool a single surface, as shown in the figures. In these regions, it may be beneficial to shield the channels from any spray impingement. The shielding of the flow from opposition by new spray droplets may be accomplished with a manufacturing process that builds the heat spreader up in layers that are subsequently fused. For example, two castings of polycarbyne can be fused into a monolithic assembly during the subsequent thermal decomposition process, such as disclosed in U.S. Pat. No. 5,516,884, which is incorporated herein by this reference.

Figure 8:
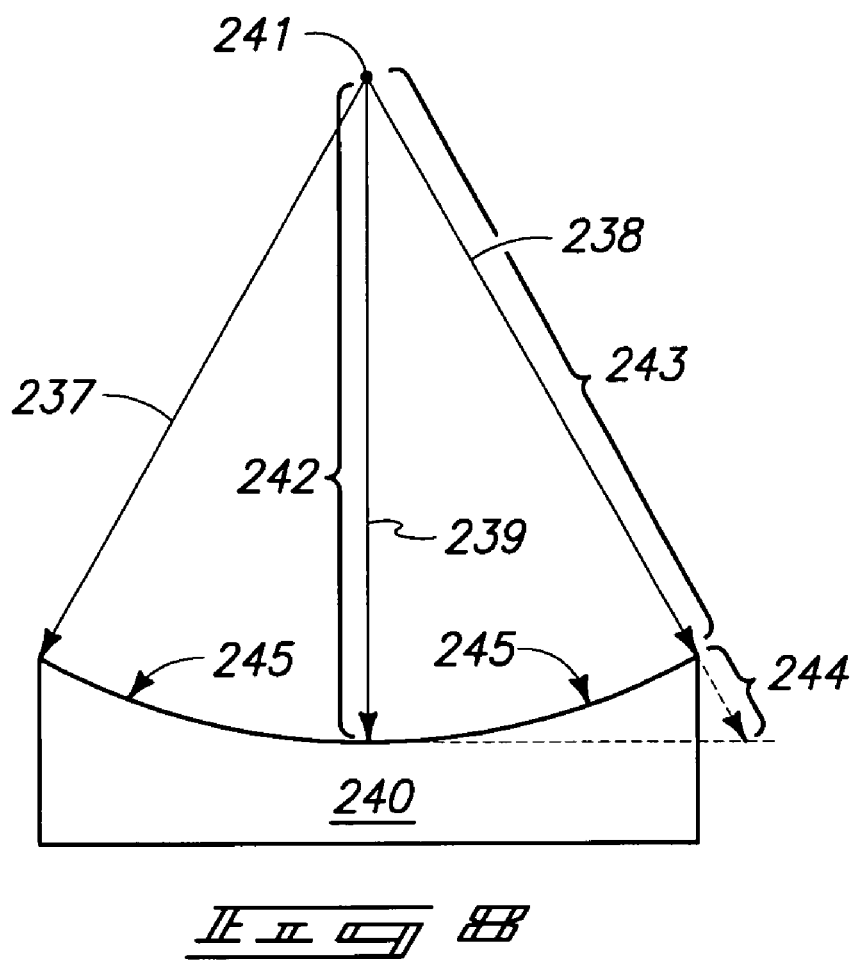
FIG. 8 is a schematic depiction of an embodiment of the invention wherein the recipient surface is arcuately configured to increase the normality of receipt of the impinging droplets.

The invention may also provide a shortened flight path for coolant droplets which are sprayed at more oblique trajectories from the outlet orifice of an atomizer. A cross section of the heat spreader might therefore be configured more dish-shaped below each atomizer, as illustrated in FIG. 8. This aspect of a thermal management system provided by this invention may be useful since the longer trajectory of the more outward droplets results in a lower velocity when arriving at the surface, which tends to compound the lower performance and/or other problems associated with a low impact angle. The heat transfer for a given thermal management system will generally be improved if all coolant drops have an equal distance, or a more equal distance, to travel, and if the impact angle, or average impact angle, is normal to their velocity vector.

The contemplation of this invention to pattern the recipient surfaces relative to the sprayed coolant droplets, may also include recipient surface patterns disposed to receive droplets sprayed or traveling in a non-uniform pattern or distributions. This invention further includes aspects which provide a dissimilar pattern for one location on the electronic component versus a second location on the same electronic component, to correspond to a hot spot or to achieve a lesser temperature gradient. These aspects may be utilized to control the density distribution of nucleation sites.

There are numerous embodiments of this invention and many of the embodiments may include some or all of certain desirable thermal management features, some of which may include: multiple small heat transfer, recipient or impingement surfaces positioned to maximize impingement effectiveness; dissimilar patterns of heat transfer surfaces modified in regions of overlapping sprays; drainage channels or passages for the removal of excess fluid; shorter travel distance for droplets with more oblique trajectories from the outlet orifice of an atomizer; reduction or elimination of spray "shadowing" effects, as discussed and illustrated more fully elsewhere herein; the pattern, geometry and/or configuration of the heat transfer surfaces being disposed relative to characteristic radial spray non-uniformities and/or hot spots; the utilization of micro-porous surfaces to provide nucleation sites. In some embodiments, some or all of these characteristics may be manipulated to achieve more uniform die temperatures.

A computational tool that optimizes the geometry of a heat spreader for a rectangular, heat-generating device such as a microprocessor may be developed and utilized. Optimization primarily refers to both reducing the surface heat flux to levels below the critical heat flux for the particular spray cooling configuration, as well as provide a uniform die temperature. The non-uniformity of sprays and microprocessor power dissipation must be accounted for. The tool should allow for single or multiple sprays, which may or may not overlap, cooling a single device of variable size and overall power dissipation. Additionally, optimum ratios between heat transfer surface area and excess fluid removal channel area may be determined for a particular application of this invention. The output should be a geometry file such as VRML, enabling an easy transformation into useable manufacturing information. Empirical data and spray cooling design guidelines specific to any given technology or company may be incorporated in an output file.

It should be noted that any one of a number of different atomizers, atomizer configurations, atomizer orifices, coolant feed systems, and other standard or desirable components may be utilized within the contemplation of this invention, with no one in particular being required to practice this invention. It should also be noted that these different components are sufficiently known in the field of art so that each one need not be described in great detail to enable one of ordinary skill in the art to practice the invention.

While some embodiments of this invention may contemplate utilizing polymer based diamond-like films, such as technology available through Penn State University, any one of a number of different materials, compositions and processes may be used in embodiments contemplated by this invention. This preferred (but not necessary) technology of polymer based diamond-like films, provides an ability to better achieve optimally configured thermal management systems such as heat spreaders.

Generally, the precursor material in the diamond-like film material is a castable liquid that can be subsequently thermally decomposed into nearly pure carbon with diamond-like properties. The processing temperatures are typically dramatically lower than competing diamond film processes. This characteristic may allow the curing process to occur directly on an interfacial layer or substrate, such as copper. In aspects of this invention, the polymer based diamond-like films may provide a combination of a high thermal conductivity heat spreader with the desired critical geometry to achieve one or more of the objects of this invention.

There will likely be additional and other materials and ways of sufficiently configuring those materials, as described herein, which may be developed and which will be usable in embodiments of this invention. This may include roughened silicon, copper, copper-tungsten and aluminum heat sinks, and artificial diamond films, both polished and as-grown.

Aspects of this thermal management system further contemplate either a separate or an integral thermal management system, heat spreader or recipient surface. These aspects will provide either separate components to be attached to a particular electronic component, or will allow the recipient surface with the raised impingement surfaces to be integrally configured as part of the electronic component or device.

FIG. 1 is an elevation view schematic representation of two exemplary spray patterns from two adjacent atomizer orifices 85 and 94, on a typical electronic component 80 with layer 81, with a typical prior art electronic component surface 79 to be cooled. The typical prior art electronic component surface 79 is relatively flat or planar. The droplets represented by item 86 from atomizer orifice 85 impact approximately normal, or at an approximate ninety-degree angle to the recipient surface 79, at point 90, resulting in an approximate impingement angle of zero.

The coolant droplets represented by item 87 from atomizer orifice 85 on the other hand will impact the recipient surface at impact point 89 at a different angle than those droplets 86 impacting at impact point 90, creating a substantial impingement angle 76 relative a normal angled impact. The corresponding angle 75 is the angle of the coolant droplets 87 relative to the recipient surface 79, with the sum of angle 75 and angle 76 being approximately ninety-degrees. FIG. 1 also illustrates coolant droplets 98 impacting recipient surface 79 at point 91.

The coolant droplets represented by item 95 from atomizer orifice 94 on the other hand will impact the recipient surface at angle 77 relative to recipient surface 79, with an approximate impingement angle 78. Coolant droplets 93 impact recipient surface 79 at point 92 and coolant droplets 94 impact the recipient surface 79 approximately normally, as shown.

FIG. 1 also illustrates point 83 which is a relatively equal distance between atomizer orifices 85 and 94, and may be cooled by coolant droplets from either or both atomizer orifices 85 or 94, as reflected by arrows 82. This area would also be an overlap area where impacting droplets may impede the flow of coolant, and for which shielding or other design changes may be implemented to assure the maintenance of the thickness of coolant film desired.

FIG. 2 is a schematic elevation view of a typical prior art heat dissipation system which utilizes heat transfer fins, illustrating the shadowing that occurs relative to the impacting coolant droplets. FIG. 2 illustrates atomizer orifice 101 or the origination point for the coolant droplets, typical heat spreader 100 with fins 104 protruding from heat spreader base 103. The bottom surface 103a of the heat spreader base 103 may be attached to an electronic component or device to be cooled.

In FIG. 2, the fins 104 provide greater surface area, however due to the radial spray pattern, the outer coolant droplets 102a typically travel farther than the more inward coolant droplets 102b. The increase in the distance of travel and/or non-equidistance of travel may tend to change the heat transfer characteristics of the impacting coolant droplets, as well as the angle of impact, as discussed more fully herein.

The configuration of the typical fins 104 relative to the atomizer orifice 101, causes shadows 105 where there is essentially no coolant provided and/or no coolant droplets impacting the surface of the heat spreader.

FIG. 3 is a perspective view of one embodiment of a raised impingement configuration 120, or raised surface. The raised impingement configuration 120 includes recipient or impingement surface 121, side surface 122 and drainage passage 123, which may be a drainage channel. It will be appreciated by those of ordinary skill in the art that no one configuration or shape is required to practice this invention, but instead any one of a number of configurations, shapes and angles may be utilized.

Furthermore, depending on the thermally desired result in heat transfer capacity, temperature gradient, or heat flux result, the impingement surface (and resulting impingement angle and/or droplet travel distances) may be varied from the optimal (such as approximately ninety-degrees for the impact angle, i.e. a zero-degree impingement angle), to more effectively manage the desired thermal characteristics of the electronic component. For example, imposing an impingement angle by varying the angle of the impingement surface at a local area on an electronic device may be accomplished in order to reduce the heat transfer at that location to reduce the temperature gradient relative to an adjacent location.

FIG. 4 is a perspective view of another exemplary embodiment of a raised impingement configuration 129, illustrating impingement surface 130, side surfaces 131 and 132, rear drainage passage border 135 and side drainage passage 134. It should be noted both in FIG. 3 and in FIG. 4, that the transition from the impingement surface to a given side surface is preferably curved or arcuate, although it is not necessary to practice the invention. It is preferred for ease of coolant flow from the impingement surface to a side surface, to provided the rounded or less abrupt transitions, which could even be more arcuate to remove distinctions between the impingement surface and the side surfaces.

It is further believed that providing an improved flow over the transition, or from an impingement surface to a drainage passage, further serves to conserve and yet use the momentum of the coolant droplets and the vapor created at the impingement surface, to maintain the coolant flow.

FIG. 5 is a top view of one of several possible patterns which may be formed in an embodiment of the invention, illustrating numerous raised impingement surfaces and drainage passages about a central area corresponding to a coolant atomizer. The atomizer orifice would typically be offset above or away from point 181, and the plurality of impingement components with impingement surfaces are shown radially disposed around point 181, in this embodiment of the invention.

It will be appreciated by those of ordinary skill in the art of thermal management of electronic components and other devices, that the impingement surfaces may be in any one of a number of configurations relative to the atomizer orifice, with no one in particular being required. In some applications, it may be desired to maximize the heat transfer capacity and rate at a given location around an atomizer orifice, while in other applications, the temperature gradient may be of more concern and maximum heat transfer is not desired.

FIG. 5 illustrates an embodiment of a thermal management system 180 contemplated by this invention, showing a plurality of first radially disposed impingement configurations 184 with impingement surfaces about point 181, with a plurality of drainage passages 182 there-between. FIG. 5 also illustrates a second plurality of impingement configurations 184 about point 181, also with drainage passages or channels in between.

FIG. 5 further shows impingement components 185 and 186, as more fully shown and depicted in the section view of FIG. 4, with radially inward impingement surface 185*a* and radially outward impingement surface 186*a*. The pattern of impingement components shown in FIG. 5 may be provided for a small or localized area on an electronic device (to cool a hot spot or area), with the remainder of a chip differently configured, or the configuration could essentially represent the pattern across the entire chip and radially inward raised impingement surface 193 and radially outward raised impingement surface 194 would as part of the pattern be similar to radially inward raised impingement surface 185*a* and radially outward raised impingement surface 186*a*, making radially inward raised impingement surfaces 185*a* and 193 a plurality and radially outward raised impingement surfaces 186*a* and 194 a plurality. FIG. 5 further shows different patterns of raised impingement surfaces, some of which are the same as each other and some of which are different or dissimilar. For examples: first raised impingement surface configuration 191 is dissimilar to second raised impingement surface configuration 192; and another first raised impingement surface configuration 193 is dissimilar to another second raised impingement surface configuration 194. These are a couple examples of several, all within the contemplation of this invention.

FIG. 6 is a schematic cross-section representation 150 of two raised impingement surfaces 185 and 186 from FIG. 5, with recipient base 150*a*, with coolant droplets 160 and 161 impacting the impingement surfaces. An electronic component 151, which is states above in paragraph 26, may be a circuit chip, is shown generating heat, with the local area or portion of the electronic component adjacent impingement component 186 shown generating more heat by arrows 152 than the heat generated adjacent impingement component 185, as represented by arrows 153. Arrows 163 and 162 depict the flow of heat through impingement components 186 and 185 respectively, with layer 155 between the source of heat in the electronic component and the impingement components.

Arrow 157 depicts the path of flight of droplet 156 and arrow 159 illustrates the path of flight of droplet 159, with angles 148 and 149 depicting the angles of impact of the droplets, the velocity vector and the impingement surface. Arrows 157 and 159 may also be referred to as the velocity vectors of the coolant droplets shown. FIG. 6 further illustrates some splashing by impacting droplets 160 and 161 as a result of impact.

FIG. 7 is a top schematic view of a four atomizer configuration, illustrating an exemplary spray pattern and a fluid drainage passage flow pattern represented by arrows 223. Atomizer orifices 204 and 205 are shown generally spraying radially outward therefrom, forming a general spray radius represented by circle 221 and 220 respectively. The overlap in spray radiuses illustrates the need for drainage passages at a different distance from the atomizer orifices to provide for the desired flow of coolant.

FIG. 8 is a schematic depiction of an embodiment of the invention wherein the recipient surface 245 of impingement component 240 is arcuately configured to increase the normality of receipt of the impinging droplets. FIG. 8 shows a normalizing pattern, i.e. a pattern which generally or approximately angles makes the droplet impact normal to the impact surface, throughout the radial spray pattern. FIG. 8 illustrates atomizer orifice 241, droplets 237, 238 and 239, all impacting impingement surface 245 at an approximate normal angle (i.e. an approximate impingement angle of zero).

FIG. 8 further illustrates the equalizing of the respective distances of travel of the droplets, in that distance 243 for the travel of coolant droplets along line of travel 238 is approximately the same distance as distance 242 which coolant droplets sprayed along line of travel 239 travel.

FIG. 8 further shows distance 244, which is the distance droplets spraying along line of travel 238 would have traveled in a prior art system wherein the impingement surface is relatively planar or flat.

In most embodiments of the invention, it may be desirable to control the flow of vapor and certain eddy and other effects, within the spray chamber in which this thermal management system may be disposed, to obtain a more uniform or as uniform coverage of coolant on the electronic components to be cooled. During the normal course of cooling, without other design features included, all of the vapor that is generated during the cooling process from the evaporation and other factors, and all of the unused liquid, generally must exit the system or chamber.

In many cases and configurations, the spraying of coolant from the atomizers is an effective vapor pump and creates a low pressure zone in the inlet area in or near the inlet area, as compared to the pressure zone at the outlet area. This may be referred to as an adverse pressure gradient. Since fluid, including vapor, flows from high pressure to low pressure and high pressure tends to develop toward the exit area, the conflict develops and eddies tend to develop in the corners near the inlet or spray atomizers as the vapor tends to move back toward the low pressure area or zones at or near the atomizers or spray coolant inlet. Interfacial drag of vapor and/or liquid and thin liquid creates a drag or pull on the liquid which is on the impingement surface or surface of the electronic components. When the eddies described above occur and sometimes increase in strength, they have the potential to block, impede or alter the spray pattern originally obtained and desired. This may cause alterations to the heat transfer, a thin film evaporation and the cooling capacity of the spray cooling system. This may also result in more spray coolant being provided to the electronic components nearer the spray side and less or inadequate coolant being supplied to the electronic components nearer the exit side, and some may not get any appreciable coolant.

In order to reduce or eliminate this problem, this invention may utilize a technique which may be referred to as "vapor re-circulation". In vapor re-circulation within the contemplation of this invention may be utilized in any one of a number of different ways within the contemplation of the invention. One way is to provide an opening or openings near the exit side of the circuit card or cooling cavity, the apertures or openings being configured to allow vapor to flow therethrough while impeding the flow of liquid.

One way to help keep the liquid out or reduce the liquid which is a cause of the impeding in the exit vapor openings, is to provide the openings with a large enough cross-sectional area that the entering vapor has a low velocity and does not entrain liquid or draw the liquid into the openings. It is also preferable, although not necessary, that the openings are at least initially near perpendicular or more to the direction of travel of the liquid or even in the opposite direction of the liquid, as liquid does not tend to turn as easily as vapor when flowing. While it would be very difficult to prevent nominal amounts of spray coolant liquid to become entrained, additional precautions may be taken to avoid re-introducing non-atomized liquid.

The vapor may then be routed back toward the spray or inlet side where it is introduced through one or more apertures or openings and provides a vapor velocity to partially or wholly prevent the eddying or back-flow effect. If the vapor re-circulation conduits are large enough in cross-section, the vapor velocity is reduced and it tends not to draw or entrain as much liquid back toward the inlet area where the vapor is being redirected. In this case no shroud is used to control the fluid but instead the vapor in the system is partially gathered and routed back to or toward the entrance side or the spray side of the cooling cavity or circuit card.

An alternative vapor re-circulation system may involve sizing the cooling cavity so wide that the vapor can be recirculated at the far side of such a wider cavity at a low enough velocity within the side channels so that liquid would not be entrained and eddies would not develop. This is not preferable in applications in which size is more important because of obvious size constraints, and further this type of vapor re-circulation system may tend to lower heat transfer coefficients.

It will be appreciated by those of ordinary skill in the art that the specific velocities and thickness of coolant or liquid being evaporated varies from application to application and no one in particular is required to practice this invention.

Another potential vapor re-circulation system is to materially increase the amount of coolant that is sprayed and to widen the array of atomizers which provide the atomized coolant to the cooling cavity. This would have the effect of impinging heavily on the entire, on all parts of the channel surfaces and in effect overpower the vapor trying to backflow or eddy. This embodiment is not preferred in many applications because it requires a substantially higher flow rate of coolant and one atomizer which becomes weak or inoperative will cause a failure of a system because a low pressure region would then be created where the failure occurred.

As will be appreciated by those of reasonable skill in the art, there are numerous embodiments to this invention, and variations of elements and components which may be used, all within the scope of this invention.

One embodiment of this invention, for example, is a thermal management system for an electronic device being liquid spray cooled, the thermal management system including a recipient base which comprises a front surface comprised of a plurality of raised impingement surfaces, the raised impingement surfaces each being oriented to receive atomized cooling fluid from a common atomizer; and a plurality of drainage passages among the plurality of raised impingement surfaces, each disposed to receive a flow of cooling fluid flow of the cooling fluid from the plurality of raised impingement surfaces and further disposed to facilitate the flow of the cooling fluid generally away from the common atomizer.

Other and additional embodiment of that above, may include systems: further wherein: the recipient base is integral with an electronic device to be cooled; the electronic device to be cooled is an integrated circuit chip; and/or the electronic device to be cooled is a semiconductor chip.

In other additional embodiments, the thermal management system as recited above may be further clarified: wherein the plurality of raised impingement surfaces are generally oriented radially outward about a center, and further sloped upward in a radially outward direction; further wherein the plurality of raised impingement surfaces are sloped upward in an arcuate configuration; wherein the plurality of raised impingement surfaces are configured to normalize an impact angle of liquid coolant on the plurality of raised impingement surfaces; and/or further wherein the recipient base has a rear side configured to be attached to an electronic device to be cooled.

In another embodiment of the invention, a thermal management system for an electronic recipient device being liquid spray cooled may be provided which comprises: a recipient base front surface with a first pattern of raised impingement surfaces which is dissimilar to a second pattern of raised impingement surfaces. In this embodiment, there may be further embodiments such as: further wherein the first pattern of raised impingement surfaces is configured to dissipate more heat than the second pattern of raised impingement surfaces; and/or wherein the first pattern of raised impingement surfaces corresponds to a first underlying heat load and the second pattern of raised impingement surfaces corresponds to a second underlying heat load which is greater than the first heat load, wherein the second pattern of raised impingement surfaces is configured to dissipate more heat than the first pattern of raised impingement surfaces.

In yet other embodiments of the invention, a thermal management system for an electronic recipient device being liquid spray cooled may be provided which comprises: a recipient base front surface with a first pattern of raised impingement surfaces configured relative to a first liquid spray atomizer which is dissimilar to a second pattern of raised impingement surfaces corresponding to a second liquid spray atomizer. Additional embodiments may include systems: further wherein the first pattern of raised impingement surfaces configured relative to a first lis configured to provide more dissipation than the second pattern of raised impingement surfaces; and/or further wherein the first pattern of raised impingement surfaces corresponds to a first underlying heat load and the second pattern of raised impingement surfaces corresponds to a second underlying heat load which is greater than the first heat load, and wherein the second pattern of raised impingement surfaces is configured to dissipate more heat than the first pattern of raised impingement surfaces.

In another embodiment, a thermal management system for an electronic recipient device being liquid spray cooled is provided which comprises: a liquid coolant atomizer; a recipient base front surface disposed to receive atomized liquid coolant from the atomizer, the front surface comprised of a plurality of raised impingement surfaces, the impingement surfaces each being oriented to receive atomized cooling fluid from the atomizer; and a plurality of drainage passages among the plurality of raised impingement surfaces and disposed to receive excess cooling fluid from the impingement surfaces.

In yet another embodiment, a thermal management system for an electronic device being liquid spray cooled is provided, the thermal management system comprising: a liquid coolant atomizer disposed to project liquid coolant radially from an orifice; a recipient base disposed to receive liquid coolant from the atomizer, the recipient base comprising: a front surface comprised of a plurality of raised impingement surfaces, the raised impingement surfaces each being oriented relative to the atomizer orifice such as to receive atomized cooling fluid from the atomizer; and a plurality of drainage passages among the plurality of raised impingement surfaces, each disposed to receive a flow of cooling fluid flow of the cooling fluid from the plurality of raised impingement surfaces and further disposed to facilitate the flow of the cooling fluid generally away from the atomizer.

Another thermal management system may comprise: a liquid coolant atomizer disposed to project liquid coolant radially from an orifice; a recipient base disposed to receive liquid coolant from the atomizer, the recipient base comprising: a front surface comprised of a plurality of raised impingement surfaces, the raised impingement surfaces each being oriented relative to the atomizer orifice such as to receive atomized cooling fluid from the atomizer; and a plurality of drainage passages among the plurality of raised impingement surfaces, each disposed to receive a flow of cooling fluid flow of the cooling fluid from the plurality of raised impingement surfaces and further disposed to facilitate the flow of the cooling fluid generally away from the atomizer.

In a process embodiment, a process for improving the rate of heat dissipation from an electronic device being liquid spray cooled may be provided, the process comprising the following: providing a recipient base configured to receive liquid coolant from an atomizer, the recipient base comprising: a front surface comprised of a plurality of raised impingement surfaces, the raised impingement surfaces each being oriented relative to the atomizer orifice such as to receive atomized cooling fluid from the atomizer; and a plurality of drainage passages among the plurality of raised impingement surfaces, each disposed to receive a flow of cooling fluid flow of the cooling fluid from the plurality of raised impingement surfaces and further disposed to facilitate the flow of the cooling fluid generally away from the atomizer.

In another of the process embodiments, a process for configuring an impingement surface utilized to dissipate heat from an electronic device being liquid spray cooled, which comprises: providing a recipient base configured to receive liquid coolant from an orifice of an atomizer which sprays liquid coolant toward the recipient base; and normalizing a plurality of impingement surfaces on the recipient base relative to the liquid coolant being sprayed.

In yet another process embodiment, a process may be provided which comprises: providing a recipient base configured to receive liquid coolant from an orifice of an atomizer which sprays liquid coolant toward the recipient base; and configuring an impingement surface on the recipient base relative to the orifice such that the distance of a plurality of impingement points on the impingement surface is approximately normal to the direction of atomized droplets from the orifice impacting the plurality of impingement points.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proer scope of the appended claims appropriately interpreted in accordance with the doctrine of equivalents.

We claim:

1. A thermal management system for an electronic device being liquid spray cooled by thin film evaporative spray cooling, the thermal management system comprising:
    a recipient base comprising:
    a front surface comprised of a plurality of radially inward raised impingement surfaces and a plurality of radially outward raised impingement surfaces, with each of the raised impingement surfaces being oriented to directly receive droplets of atomized cooling fluid from a common atomizer which sprays the liquid the cooling fluid at an approximate angle of ninety degrees wherein the plurality of radially inward raised impingement surfaces being at an angle to the recipient base less than the plurality of radially outward raised impingement surfaces to manage heat transfer;
    a plurality of drainage passages among the plurality of raised impingement surfaces, each disposed to receive a flow of cooling fluid flow of the cooling fluid from the plurality of raised impingement surfaces and further disposed to facilitate the flow of the cooling fluid generally away from the common atomizer; and
    further wherein the plurality of raised impingement surfaces are configured to normalize an impact angle of liquid coolant on the substantial area of the plurality of raised impingement surfaces.

2. A thermal management system as recited in claim 1, and further wherein the recipient base is integral with an electronic device to be cooled.

3. A thermal management system as recited in claim 2, and further wherein the electronic device to be cooled is an integrated circuit chip.

4. A thermal management system as recited in claim 2, and further wherein the electronic device to be cooled is a semiconductor chip.

5. A thermal management system as recited in claim 1, and further wherein the plurality of radially inward raised impingement surfaces and the plurality of radially outward raised impingement surfaces are generally oriented radially outward about a center, and further wherein the plurality of radially outward raised impingement surfaces are elevationally higher than the plurality of radially inward raised impingement surfaces.

6. A thermal management system as recited in claim 5, and further wherein the plurality of raised impingement surfaces are sloped upward in an arcuate configuration.

7. A thermal management system as recited in claim 6, and further wherein the plurality of raised impingement surfaces are configured to normalize an impact angle of liquid coolant on the plurality of raised impingement surfaces.

8. A thermal management system as recited in claim 7, and further wherein the recipient base has a rear side configured to be attached to an electronic device to be cooled.

9. A thermal management system for an electronic recipient device being, liquid spray cooled by thin film evaporative spray cooling, the thermal management system comprising:
    a recipient base front surface with a first raised impingement surface configuration at an angle relative to the recipient base which is dissimilar to an angle of a second raised impingement surface configuration relative to the recipient base, and further wherein the first raised impingement surface and the second raised impingement surface are configured to normalize an impact angle of droplets of liquid coolant received directly from a common atomizer on the substantial area of the plurality of raised impingement surfaces; the atomizer sprays the liquid coolant an approximate angle of ninety degrees.

10. A thermal management system as recited in claim 9, and further wherein the first raised impingement surface configuration is configured to dissipate more heat than the second raised impingement surface configuration.

11. A thermal management system as recited in claim 9, and further wherein the first raised impingement surface configuration corresponds to a first underlying heat load and the second raised impingement surface configuration corresponds to a second underlying heat load which is greater than the first heat load, wherein the second pattern of raised impingement surfaces is configured to dissipate more heat than the first pattern of raised impingement surfaces.

12. A thermal management system for an electronic recipient device being liquid spray cooled by thin film evaporative spray cooling, the thermal management system comprising:

a recipient base front surface with a first raised impingement surface configuration configured at an angle relative to a first liquid spray atomizer which is dissimilar to an angle of a second raised impingement surface configuration corresponding to a second liquid spray atomizer, and further wherein the first raised impingement surface configuration and the second raised impingement surface configuration are arranged to receive droplets of atomized liquid coolant sprayed directly from the first liquid spray atomizer which sprays the liquid coolant at an approximate angle of ninety degrees.

13. A thermal management system as recited in claim 12, and further wherein the first raised impingement surface configuration is configured to provide more heat dissipation than the second raised impingement surface configuration based on the relative orientation of the first raised impingement surface relative to the second raised impingement surface.

14. A thermal management system as recited in claim 12, and further wherein the first raised impingement surface configuration corresponds to a first underlying heat load and the second raised impingement surface configuration corresponds to a second underlying heat load which is greater than the first heat load, wherein the second raised impingement surface configuration is configured to dissipate more heat than the first raised impingement surface configuration.

15. A thermal management system for an electronic recipient device being liquid spray cooled by thin film evaporative spray cooling, the thermal management system comprising:
   a liquid coolant atomizer;
   a recipient base front surface disposed to directly receive droplets of atomized liquid coolant from the atomizer, the front surface comprised of a plurality of raised impingement surfaces, the plurality of radially inward raised impingement surfaces and a plurality of radially outward raised impingement surfaces, with each being oriented to directly receive atomized cooling fluid from the atomizer at an approximate angle of ninety degrees; and
   a plurality of drainage passages among the plurality of raised impingement surfaces and disposed to receive excess cooling fluid from the impingement surfaces.

16. A process for improving the rate of heat dissipation from an electronic device being liquid spray cooled by thin film evaporative spray cooling, the process comprising the following:
   providing a recipient base configured to receive liquid coolant from an atomizer, the recipient base comprising:
   a front surface comprised of a plurality of radially inward raised impingement surfaces and a plurality of radially outward raised impingement surfaces, with each of the raised impingement surfaces being oriented relative to the atomizer orifice such as to directly receive droplets of atomized cooling fluid from the atomizer which sprays the cooling fluid at an approximate angle of ninety degrees, wherein the plurality of radially inward raised impingement surfaces being at an angle to the recipient base less than the plurality of radially outward raised impingement surfaces to manage heat transfer; and a plurality of drainage passages among the plurality of raised impingement surfaces, each disposed to receive a flow of cooling fluid flow of the cooling fluid from the plurality of raised impingement surfaces and further disposed to facilitate the flow of the cooling fluid generally away from the atomizer; and
   spraying liquid coolant from an atomizer on the front surface of the recipient base.

17. A process for improving the rate of heat dissipation from an electronic device being liquid spray cooled by thin film evaporative spray cooling as recited in claim 16, and further wherein the front surface is configured to normalize an impact angle of leuid coolant on the front surface.

18. A process for configuring an impingement surface utilized to dissipate heat from an electronic device being liquid spray cooled by thin film evaporative spray cooling, the process comprising the following:
   providing a recipient base configured to receive liquid coolant from an orifice of an atomizer which sprays liquid, coolant toward the recipient base; and
   normalizing a surface of a plurality of radially inward impingement surfaces and a surface of a plurality of radially outward impingement surfaces on the recipient base relative to the liquid coolant being sprayed so that droplets of the liquid coolant is received directly from the atomizer which sprays the liquid coolant at an approximate angle of ninety degrees.

19. A thermal management system for an electronic recipient device being liquid spray cooled by thin film evaporative spray cooling, the thermal management system comprising: a liquid coolant atomizer; a recipient base comprising: a front surface comprised of a plurality of radially inward raised impingement surfaces and a plurality of radially outward raised impingement surfaces, with each of the raised impingement surfaces being oriented to directly receive droplets of atomized cooling fluid sprayed from a common atomizer at an approximate angle of ninety degrees, wherein the plurality of radially inward raised impingement surfaces being at an angle to the recipient base less than the plurality of radially outward raised impingement surfaces to manage heat transfer;
   a plurality of drainage passages among the plurality of raised impingement surfaces, each disposed to receive a flow of cooling fluid flow of the cooling fluid from the plurality of raised impingement surfaces and further disposed to facilitate the flow of the cooling fluid generally away from the common atomizer; and
   wherein the plurality of radially inward raised impingement surfaces and the plurality of radially outward raised impingement surfaces are generally oriented radially outward about a center, and further wherein the plurality of radially outward raised impingement surfaces are elevationally higher than the plurality of radially inward raised impingement surfaces.

20. A thermal management system for an electronic recipient device being liquid spray cooled by thin film evaporative spray cooling as recited in claim 19, and further wherein the plurality of raised impingement surfaces are sloped upward in an arcuate configuration.

\* \* \* \* \*